PRINTED-CIRCUIT TYPE LEAD WIRE CONNECTORS

Filed Sept. 8, 1959

INVENTOR.
JAMES E. STARR
BY

ATTORNEY

United States Patent Office 3,005,170

Patented Oct. 17, 1961

3,005,170
PRINTED-CIRCUIT TYPE LEAD WIRE CONNECTORS

James E. Starr, Norristown, Pa., assignor, by mesne assignments, to The Budd Company, Philadelphia, Pa., a corporation of Pennsylvania Filed Sept. 8, 1959, Ser. No. 838,776
1 Claim. (Cl. 338—2)

This invention pertains to printed-circuit type lead wire connectors for fragile electric circuit components and more particularly to such connectors as adapted to provide for solder connection of resistance strain gauge lead wires and the like.

Many electric circuit components comprise a configuration of an attenuated conductor which has such minute dimensions, dictated by the electric function of the component, that it is mechanically weak. Such conductors are not capable of withstanding lead wire stresses without rupture or disruption of the desired configuration.

It is conventional that the conductors of these components are provided with integral extensions for connection with circuit leads. Circuit leads, especially when they are of some length, must have mechanical strength, low resistivity, and be electrically insulated. These latter requirements cause circuit leads to be relatively heavy and inflexible so that they cannot be directly connected to the fragile components. Therefore, short, flexible, intermediate leads are joined to the conductor of the component and, at intermediate junctions, to the circuit leads.

In the past there has been no completely satisfactory wiring device for use at these junctions. Prior expedients have transmitted undesirable stresses or have been inconvenient or expensive. A particular disadvantage has been the difficulty of soldering a second lead to a connector without destroying the solder bond of a first lead previously attached.

Therefore, it is an object of this invention to provide a more efficient and inexpensive connector for use at junctions between component and circuit leads, which connector is adapted for stress relief, positive spacial orientation, and optimum application by convenient soldering techniques.

A more specific object is to provide a lead-wire connector which can be produced by printed-circuit techniques, is capable of rigid support and low-resistance connection of component and circuit lead wires, and which provides solderable junction areas electrically connected but sufficiently separated thermally so that a second lead wire may be soldered to the junction without affecting the soldered connection of a first lead wire already attached to the junction.

According to an illustrated embodiment of this invention, a lead wire connector comprises a strip of electrical and thermal insulating material and a printed-circuit type, metal junction pattern formed on the strip, the pattern having opposed major areas for attachment of electrical conductors and attenuated temperature-gradient amplification areas extending between and electrically connecting the major areas. In a preferred form, the device comprises a plurality of pairs of the junction patterns, each pattern in a pair being spaced from the other pattern of the pair of distance proportional to the separation between the connection tabs of a given type of resistance strain gauge.

The novel features of this invention are particularly pointed out in the appended claim. However, for a better understanding of this invention, together with further objects and advantages thereof, reference is had to the following description taken in conjunction with the accompanying drawing wherein:

Figure 1:
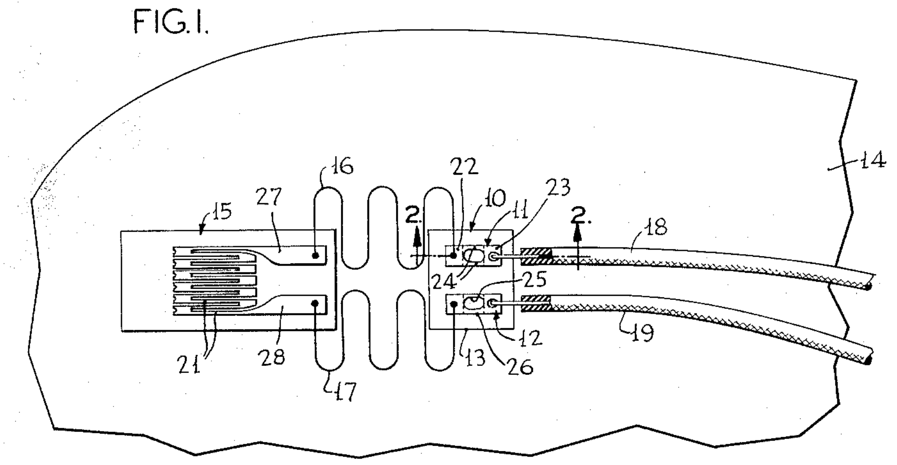
FIG. 1 is a connector according to this invention as applied in conjunction with a resistance strain gauge.

With particular reference to FIG. 1, a connector according to this invention is designated generally as 10, and includes two metal pattern junctions 11 and 12 bonded to an insulator 13. The connector 10 is shown anchored to a workpiece 14 by any suitable means, as is a resistance strain gauge 15. Intermediate leads 16 and 17 are of small-gauge flexible wire and circuit leads 18 and 19 are the heavier, insulated, low-resistance leads which may be extended to associated circuitry not shown in the figure.

Figure 2:
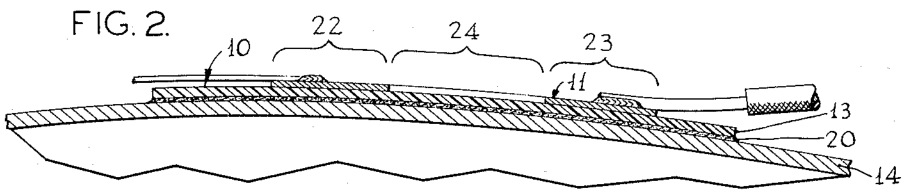
FIG. 2 is a cross-section through a junction pattern of the connector of FIG. 1.

As seen more clearly in the cross-section of FIG. 2, the connector 10 comprises a base 13 of an insulating material, preferably in extended strip form, conventional in the printed-circuit art. Formed on the base 13 by any of the various printed-circuit technicques is a metal film junction pattern 11. The metal film 11 is extremely thin, 0.0017″ for example, and of uniform thickness. Copper is the preferred metal; however, silver, copper alloys, and other solderable metals may be advantageously employed. The base 13 is a reinforced, high-temperature plastic such as a glass-epoxy strip. The connector 10 is readily anchorable to a suitable support, e.g. workpiece 14, by a layer of an adhesive bonding material 20, the same material as is used for bonding an associated circuit component such as strain gauge 15 to the workpiece 14.

With further particular reference to FIG. 1, a preferred type of strain gauge, the resistance foil gauge 15, is illustrative of a fragile component for which the connector of this invention solves long standing connection problems. The gauge 15 comprises a fragile, non-self-supporting foil pattern of a series of parallel sensitive elements 21. Since the gauge 15 is sensitive to strains, it is necessary to eliminate all strain effects except those of the surface area of workpiece 14 under investigation; and since strain effects are evidenced as resistance effects, the remainder of the strain gauge circuit must be of invariant resistance and of sufficiently low resistance so as not to mask the workpiece-strain induced resistance changes.

It is immediately apparent that low-resistance, hence relatively heavy and inflexible, circuit leads 18 and 19 cannot be connected directly to the strain gauge 15. Therefore, it has been common practice to utilize a pair of intermediate leads, 16 and 17. The latter are fine wires chosen for flexibility, but necessarily relatively weak and of higher resistivity. Since leads 16 and 17 are chosen for their inability to transmit mechanical strains, it follows that they are not capable of any significant load-carrying capacity and they must be kept short so as not to introduce appreciable resistance in the strain gauge circuit. From such observations the necessity for a connector between intermediate and circuit leads is apparent.

If the intermediate leads 16 and 17 were to be soldered directly to the circuit leads 18 and 19, they would be liable to receive stresses from the latter. Even the smallest gauge leads are capable of transmitting sufficient stress to a highly sensitive strain gauge 15 so as to cause an anomalous gauge indication. Therefore, the junction points should be rigid and unaffected by mechanical stresses transmitted along the lead wires. The necessary anchoring is readily accomplished with the connectors of this invention by adhesive bonding to any suitable support. The area of the bond, equal to the area of the backing insulator 13, may be varied as desired for a particular application. Further, the connector 10, preferably less than 0.01" in total thickness, is flexible and conformable to variously contoured shapes—shaft, fillet, aperture, et cetera—allowing surface rather than tangential bonding contact.

Another significant advantage provided by a connector 10 according to this invention is that first and second soldered connections to one junction pattern, 11 or 12, can be made independently and without effect upon a prior solder bond.

It will be realized that to interrupt a soldered joint, and especially when there is any slight load on the joint, it is only necessary to raise a portion of the solder between the parts of the joint to a temperature above the solder fusion temperature. Further, it is well known that soldering temperatures exceed the fusion temperatures of solder alloys. This is attributable to the presence of surface films or oxides, to thermal capacity of the solder or of the parts to be joined, and to the necessity of reducing the viscosity of the fused solder sufficiently for wetting and flow between and into the interstices of the parts at the junction. It is impractical to control the heat for soldering so precisely that minimum soldering temperature is not exceeded. As used herein, soldering temperatures defined to include the above considerations, may exceed fusion or solder joint rupture temperatures by tens of Fahrenheit degrees.

Generally, when a soldering temperature is applied at one position on a connector a temperature gradient is set up between that position and any other position on the connector, and fusion temperatures for the solder may be exceeded at the latter position allowing rupture of an existing solder bond.

Conventionally, this problem is attacked by lengthening the connector, by reducing lateral dimensions, by clamping jigs, and ultimately by especially trained technicians. Lengthening makes a connector unwieldly; reducing lateral dimensions produces deficient soldering position areas; the inefficiency of the other attempted solutions is obvious.

According to this invention, however, temperature gradient amplification is inherent in the connector so that maintenance of soldering temperatures at one attachment position, 22 in FIG. 2, does not result in attainment of fusion temperature at the other soldering position, 23 in FIG. 2 (or vice versa) during any ordinary soldering operation. This is accomplished without reduction of soldering position areas 22 and 23 and without exceeding minimum spacial separation of the soldering positions.

The junction pattern of the connector according to this invention comprises the two opposed, major, soldering position portions 22 and 23 and interposed temperature gradient amplification portions 24 which prevent attainment of solder fusion temperature at one opposed portion during application of soldering temperature at the other.

Temperature gradient is the rate of change of temperature with respect to increasing distance along a path from a heat source or, in this particular case, the change of temperature from a first position where a soldering temperature is maintained to a second position where a solder fusion temperature must not be exceeded. The magnitude of the temperature gradient depends mainly upon the thermal resistance along the conductive path between the positions. It follows that an increase in thermal resistivity per unit path length results in temperature gradient amplification.

The above is an empirical explanation of the function of the attenuated intermediate sections 24 of the junction pattern of the connector 10 according to this invention. The preferred pattern is defined by a circular inner edge 25 located symmetrically within a substantially rectangular outer edge 26. The thermal resistance of the conductive path between soldering positions 22 and 23 is thereby increased over that of a conventional single-edge, generally rectangular pattern, to provide the desired temperature gradient amplification. It should be noted that the major width of the metal pattern is not dictated by minimum electrical conductance considerations but, rather, by the minimum area necessary for solder attachment of lead wires.

As illustrated in FIG. 1, the preferred embodiments of this invention are for applications with resistance strain gauges. Each connector 10 comprises a pair of junction patterns 11 and 12 formed on a common backing insulator 13. This construction assures uniform and convenient spacing of the junctions with respect to the integral strain gauge leads 27 and 28, so that an optimum impedance may be reproduced for a plurality of strain gauge-connector applications.

Figure 3:
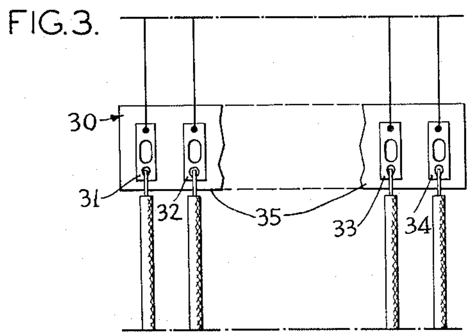
FIG. 3 illustrates a multiple connector embodiment of this invention.

FIG. 3 illustrates an extension of the above principle for use with an array of circuit components. The connector 30 comprises a plurality of pairs of junction patterns 31, 32 and 33, 34, formed on a unitary backing insulator strip 35. The connector 30 may have a number of connector pairs equal to a number of associated circuit components and be used in one piece. A further advantage, however, is that this embodiment forms a convenient unit for manufacture, distribution, and storage from which a desired number of junction patterns may be readily separated by the ultimate user, either before or after bonding to a suitable support. In many cases it is convenient to use one end of the extended backing strip 35 as a handle while a desired number of junction pairs at the other end is anchored in position on a workpiece. The excess length is later separated from the applied portion after the bonding is completed.

In view of the common knowledge of printed circuit manufacturing techniques, it is not deemed necessary to give a lengthy description thereof. It should be sufficient to point out that these processes comprise formation of a conducting pattern on the backing insulator by differential deposition or removal of a metal layer within masked or unmasked areas. The preferred technique, however, is that which yields a high strength laminate between conducting pattern and backing insulator. Otherwise, additional support may be necessary for highly stressed circuit leads.

While there have been described what are at present considered to be the preferred embodiments of this invention, it will be obvious to those skilled in the art that various changes and modifications may be made therein without departing from the invention, and it is, therefore, aimed in the appended claim to cover all such changes and modifications as fall within the true spirit of scope of the invention.

What is claimed is:

A solderable strain gauge lead wire connector for stress isolating, electrical interconnection of the stressable leads of an external circuit and the unstressable leads of a resistance strain gauge bonded to a workpiece, said connector comprising a unitary printed circuit laminate of a metal layer and an insulating layer, said metal layer being conformed as a pair of similar, symmetrical, rectangular junction patterns each having an outer closed edge and an inner closed edge defining between said edges two opposed major lead attachment surface areas at the narrower ends of said patterns and two symmetrical attenuated temperature gradient amplification surface areas at the sides of said patterns, each said inner edge being substantially elliptic and spaced from the narrower ends of each said outer edge a distance at least substantially equal to the width of said ends, said temperature gradient amplification areas having length-to-width ratios predetermined with respect to soldering materials and reducing soldering temperatures maintained at one said major attachment area below solder fusion temperatures at the other of said major attachment areas, and means coextensive with said insulating layer adhesively bonding said connector to said workpiece.

References Cited in the file of this patent

UNITED STATES PATENTS

| | | |
|---|---|---|
| 994,744 | Hall | June 13, 1911 |
| 1,875,241 | Idank | Aug. 30, 1932 |
| 2,386,171 | Wild | Oct. 2, 1945 |
| 2,459,390 | Olson | Jan. 18, 1949 |
| 2,491,794 | Bachman | Dec. 20, 1949 |
| 2,640,185 | Alden | May 26, 1953 |
| 2,885,524 | Eisler | May 5, 1959 |